US009362359B2

(12) United States Patent
Ogura et al.

(10) Patent No.: US 9,362,359 B2
(45) Date of Patent: Jun. 7, 2016

(54) SEMICONDUCTOR DEVICE (71) Applicant: KABUSHIKI KAISHA TOSHIBA, Tokyo (JP)

(72) Inventors: Tsuneo Ogura, Kamakura Kanagawa (JP); Tomoko Matsudai, Shibuya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 14/328,109

(22) Filed: Jul. 10, 2014

(65) Prior Publication Data
US 2015/0263146 A1 Sep. 17, 2015

(30) Foreign Application Priority Data

Mar. 13, 2014 (JP) .................... 2014-050090

(51) Int. Cl.
*H01L 29/06* (2006.01)
*H01L 29/739* (2006.01)
*H01L 29/10* (2006.01)
*H01L 29/45* (2006.01)
*H01L 29/47* (2006.01)

(52) U.S. Cl.
CPC ........ *H01L 29/0696* (2013.01); *H01L 29/7397* (2013.01); *H01L 29/1095* (2013.01); *H01L 29/45* (2013.01); *H01L 29/47* (2013.01)

(58) Field of Classification Search
CPC ............ H01L 29/7395; H01L 29/1095; H01L 29/0696; H01L 29/7397; H01L 29/45; H01L 29/47
See application file for complete search history.

(56) References Cited

U.S. PATENT DOCUMENTS

| 5,396,087 A * | 3/1995 | Baliga ................. H01L 29/0653 257/133 |
| 5,488,236 A * | 1/1996 | Baliga ................. H01L 29/1095 257/132 |
| 5,751,023 A * | 5/1998 | Aono ................... H01L 29/7397 257/138 |

FOREIGN PATENT DOCUMENTS

| JP | H0541515 A | 2/1993 |
| JP | H11345969 A | 12/1999 |
| JP | 2012069735 A | 4/2012 |

(Continued)

OTHER PUBLICATIONS

Korean Office Action dated Oct. 22, 2015, filed in Korean counterpart Application No. 10-2014-0082505, 12 pages (with translation).

(Continued)

*Primary Examiner* — Ermias Woldegeorgis
(74) *Attorney, Agent, or Firm* — Patterson & Sheridan, LLP (57) ABSTRACT

A semiconductor device in an embodiment includes a first region of a second conductivity type between a first electrode and a second electrode and a second region of a first conductivity type between the first region and the second electrode. a third region of the second conductivity type is between the second region and the second electrode. A fourth and fifth region of the first conductivity type are between the third semiconductor region and the second electrode. The fourth and fifth regions are adjacent to each other. A dopant concentration in the fifth region is less than a dopant concentration in the fourth region. A third electrode contacts the second region, the third region, the fourth region, and the fifth region via an insulating film.

20 Claims, 9 Drawing Sheets

(56) References Cited

FOREIGN PATENT DOCUMENTS

| JP | 2013084904 A | 5/2013 |
|---|---|---|
| TW | 327244 | 2/1998 |

OTHER PUBLICATIONS

Taiwan Office Action dated Dec. 8, 2015, filed in Taiwan counterpart Application No. 103125366, 6 pages. (with translation).

* cited by examiner

SEMICONDUCTOR DEVICE

CROSS-REFERENCE TO RELATED APPLICATION

This application is based upon and claims the benefit of priority from Japanese Patent Application No. 2014-050090, filed Mar. 13, 2014, the entire contents of which are incorporated herein by reference.

FIELD

Embodiments described herein relate generally to a semiconductor device.

BACKGROUND

Insulated gate bipolar transistors (IGBTs) are widely used as power devices because they could have breakdown voltages that are equal to or higher than 600 V. IGBTs are designed such that when a voltage is applied in a forward direction the current at a steady state is not saturated, which prevents "latch-up" in the device. However, when a conducting IGBT is switched to a non-conducting state ("turned-off"), current may concentrate and latch-up may occur causing device breaking down. Particularly, in order to reduce the size of a chip, it is necessary to increase current density while avoiding a breakdown during turn-off operations.

DETAILED DESCRIPTION

Embodiments provide a semiconductor device having improved breakdown resistance.

According to an embodiment, a semiconductor device having regions of first and second conductivity types that are opposite conductivity types includes: a first semiconductor region of the second conductivity type between, in a first direction, a first electrode and a second electrode; a second semiconductor region of the first conductivity type between, in the first direction, the first semiconductor region and the second electrode; a third semiconductor region of the second conductivity type between, in the first direction, the second semiconductor region and the second electrode; a fourth semiconductor region of the first conductivity type between, in the first direction, the third semiconductor region and the second electrode; a fifth semiconductor region of the first conductivity type between, in the first direction, the third semiconductor region and the second electrode, the fourth and fifth semiconductor regions being adjacent to each other in a second direction that is perpendicular to the first direction, a dopant density in the fifth semiconductor region being less than a dopant density in the fourth semiconductor region; and a third electrode contacting the second semiconductor region, the third semiconductor region, the fourth semiconductor region, and the fifth semiconductor region via an insulating film.

Hereinafter, example embodiments will be described with reference to the accompanying drawings. In the following description, the same reference symbol will be used for substantially similar elements, and if an element is described once in conjunction with one example, the corresponding element description may be omitted in other examples.

First Embodiment

Figure 1:
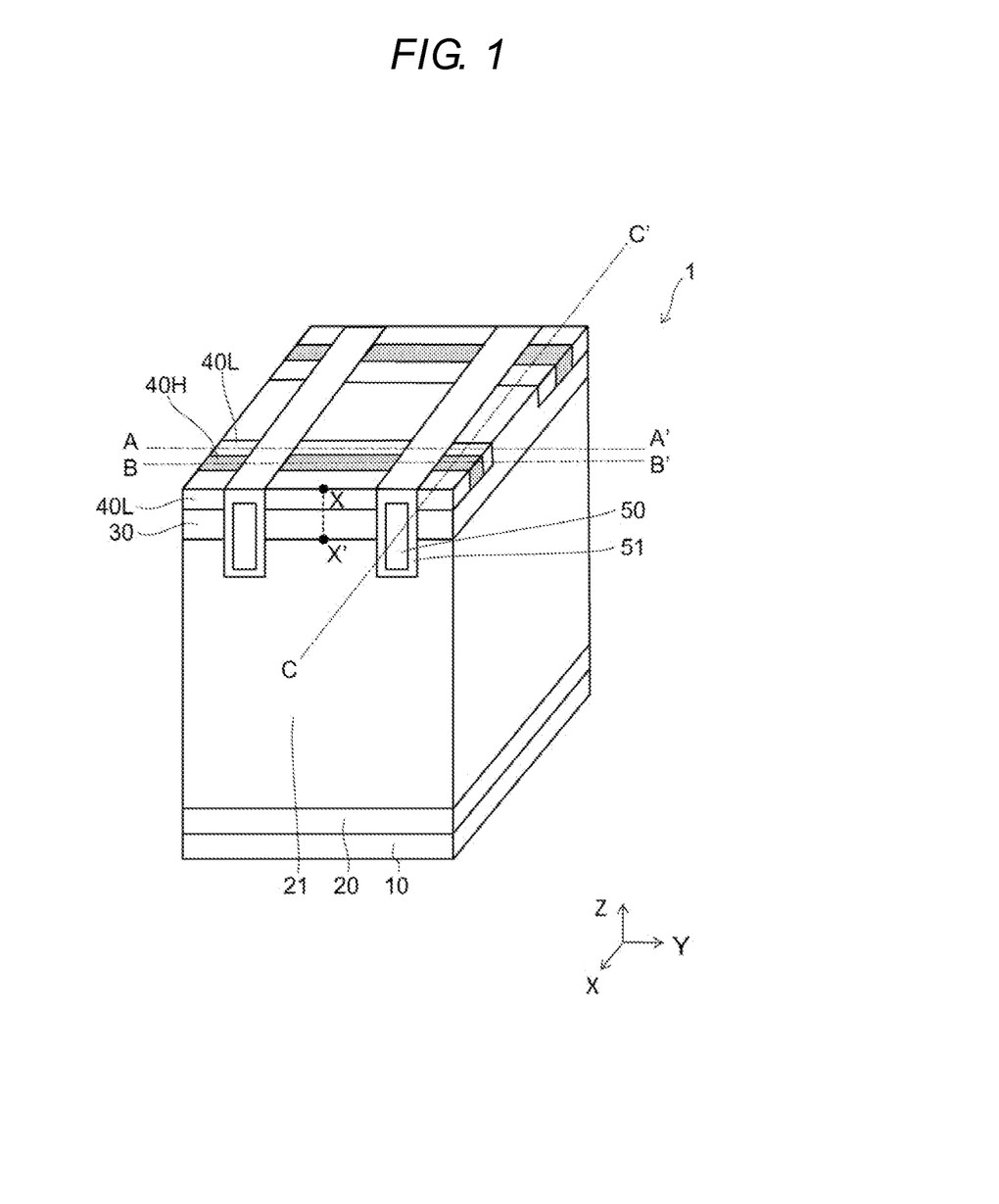
FIG. 1 depicts a semiconductor device according to a first embodiment.

FIG. 1 depicts a semiconductor device according to a first embodiment.

Figure 2A:
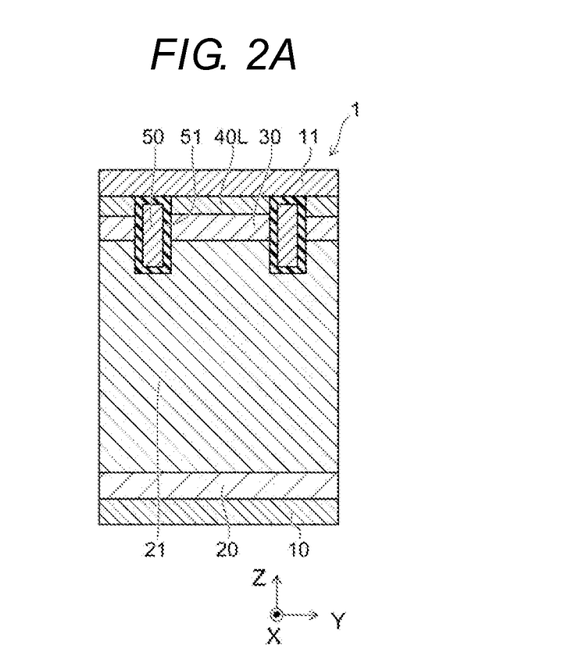
FIGS. 2A to 2C are cross-sectional views schematically illustrating the semiconductor device according to the first embodiment.
Figure 2B:
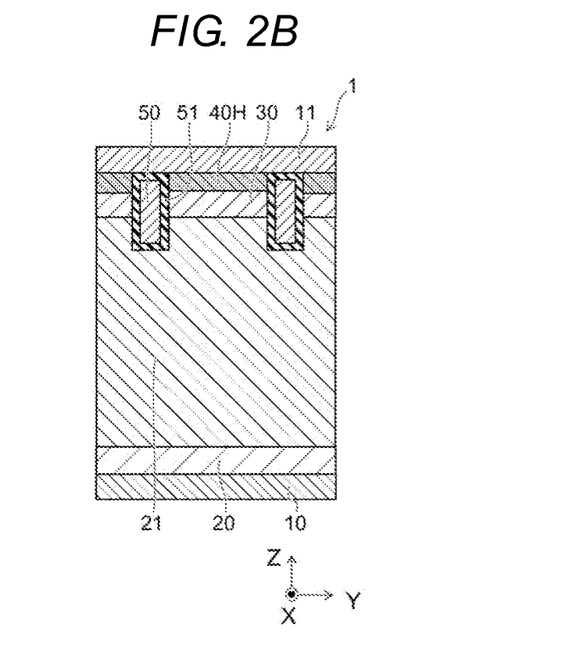
Figure 2C:
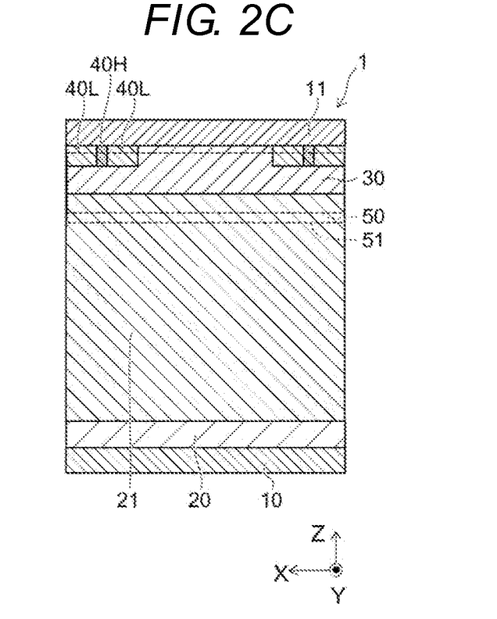

FIGS. 2A to 2C are cross-sectional views schematically illustrating the semiconductor device according to the first embodiment.

Here, FIG. 2A illustrates a cross section view of a semiconductor device 1 at a line A-A' in FIG. 1. FIG. 2B illustrates a cross section view of the semiconductor device 1 at a line B-B' of FIG. 1. FIG. 2C illustrates a cross section of semiconductor device 1 at a line C-C' of FIG. 1. Also, in FIG. 1, an emitter electrode 11 that is illustrated in FIGS. 2A to 2C is not specifically depicted.

The semiconductor device 1 is an insulated gate bipolar transistor (IGBT) having a vertical structure. The semiconductor device 1 includes a collector electrode 10 (a first electrode) and the emitter electrode 11 (a second electrode). Between the collector electrode 10 and the emitter electrode 11, a $p^+$ type collector region 20 (a first semiconductor region) is provided. The collector region 20 is in ohmic contact with the collector electrode 10.

Between the collector region 20 and the emitter electrode 11, an $n^-$ type base region 21 (a second semiconductor region) is provided.

Between the base region 21 and the emitter electrode 11, a p type base region 30 (a third semiconductor region) is provided. The base region 30 is in ohmic contact with the emitter electrode 11.

Between the base region 30 and the emitter electrode 11, $n^+$ type emitter regions 40H (fourth semiconductor regions) and n type emitter regions 40L (fifth semiconductor regions) are provided. The emitter regions 40H are in ohmic contact with the emitter electrode 11. The emitter regions 40L are in ohmic contact or Schottky contact with the emitter electrode 11. The emitter regions 40L are adjacent to the emitter regions 40H.

The dopant density of the emitter regions 40L is lower than the dopant density of the emitter regions 40H. That is, the emitter regions of the semiconductor device 1 include the emitter regions 40H having a high impurity (dopant) density, and the emitter regions 40L having a low impurity (dopant) density.

The emitter regions 40H and the emitter regions 40L are arranged in an X direction (a second direction) intersecting with the Z direction (a first direction) from the collector electrode 10 to the emitter electrode 11. Also, in the X direction, the widths of the emitter regions 40H are smaller than the widths of the emitter regions 40L. Further, the width of each emitter region 40L in the X direction is greater than a distance the n type dopants of the emitter regions 40H would diffuse in the semiconductor material during heating steps occurring during wafer processing during device fabrication steps.

For example, in the X direction, the width of each emitter region 40L is 1 μm to 5 μm, and the width of each emitter region 40H is 0.1 μm to 1 μm.

Also, the density (concentration) of dopants in the semiconductor material at a surface in contact with an electrode, for example, is referred to as a surface impurity density. The surface impurity density of the collector region 20 in semiconductor device 1 is greater than $3 \times 10^{17}$ cm$^{-3}$ (atoms/cm$^3$), for example, $1 \times 10^{18}$ cm$^{-3}$ or greater. The dopant density of the base region 21 is equal to or less than, for example, $1 \times 10^{15}$ cm$^{-3}$, and may be set to an arbitrary impurity density determined in consideration of the intended breakdown voltage of the device. The surface impurity density of the base region 30 is equal to or greater than $1 \times 10^{17}$ cm$^{-3}$. Preferably, the surface impurity density of each emitter region 40H is equal to or greater than $5 \times 10^{18}$ cm$^{-3}$. Preferably, the surface impurity density of each emitter region 40L is equal to or less than $1 \times 10^{18}$ cm$^{-3}$.

These impurity densities may be such that a portion of the respective region which is closer to the electrode has a relatively greater density than other portions of the region, or alternatively the region may have an impurity density with a maximum value at a middle portion of the region thickness. That is, an impurity density profiles within a region need not be flat through region thickness (e.g., Z-direction in FIG. 1), but may have a local maximum that is proximate to a surface or boundary of the region or the local maximum, if there is one, may be within the interior of the region.

In the first embodiment, it is effective that the maximum impurity density of each emitter region 40H is equal to or greater than $5 \times 10^{18}$ cm$^{-3}$, and the maximum impurity density of each emitter region 40L is equal to or less than $1 \times 10^{18}$ cm$^{-3}$. This is because the density difference between these regions 40H and 40L causes a potential difference which promotes the above described effects. Also, this relationship does not depend on design parameters other than the breakdown voltage of the device. This is because the above described effects due to a potential difference are constant regardless of the breakdown voltage of the device.

A gate electrode 50 (third electrode) is in contact with base region 21, base region 30, emitter regions 40H, and emitter regions 40L via a gate insulating film 51 interposed between the gate electrode and the regions adjacent. A plurality of gate electrodes 50 and the gate insulating films 51 extend in the X direction. The emitter regions 40H and the emitter regions 40L extend in a Y direction intersecting with the X direction and the Z direction. That is, the gate electrodes 50 are substantially perpendicular to the emitter regions 40H and the emitter regions 40L.

Each of the collector region 20, the base region 21, the base region 30, and the emitter regions 40H and 40L is comprised of, for example, silicon (Si). For dopants of a n-type conductivity (a first conductivity type, in this example) such as the n$^+$ type, the n type, or the n$^-$ type, for example, phosphorous (P), arsenic (As), or the like may be applied. As dopants of a p-type conductivity (a second conductivity type, in this example) such as the p$^+$ type or the p type, for example, boron (B) or the like may be applied. In some embodiments, each of the collector region 20, the base region 21, the base region 30, and the emitter regions 40H and 40L may be comprised of, for example, silicon carbide (SiC), gallium nitride (GaN), or the like, rather than silicon (Si).

Also, in general, the densities (concentration levels) of n type dopants decreases in the order from the n$^+$ type to the n type, and from the n type to the n$^-$ type, unless otherwise mentioned. Furthermore, in general, the densities (concentration levels) of p type dopants decrease in the order from the p$^+$ type to the p type and from p type to the p$^-$ type. Also, in the semiconductor device 1, conductivity types of p-type and n-type may be reversed (i.e., p-type may correspond to the first conductivity type and n-type may correspond to the second conductivity type) with each other and similar operational effects may be achieved.

Also, unless otherwise stated, in the present example, the dopant density of an n$^+$ type semiconductor region being greater than the dopant density of an n type semiconductor region includes the case of the dopant density at the surface of the n$^+$ type semiconductor region in contact with an electrode being greater than the dopant density of an n type semiconductor region. Also, in the present example, the dopant density of an p$^+$ type semiconductor region being greater than the dopant density of a p type semiconductor region includes the case of the dopant density at the surface of the p$^+$ type semiconductor region in contact with an electrode being greater than the dopant density of the p type semiconductor region at the surface of the p type semiconductor region in contact with the electrode.

Each of the materials of the collector electrode 10 and the emitter electrode 11 may be, for example, a metal including at least one metal selected from a group including aluminum (Al), titanium (Ti), nickel (Ni), tungsten (W), gold (Au), and the like. The material of the gate electrodes 50 includes, for example, polysilicon. Also, the material of the insulating films includes, for example, silicon oxide.

In the semiconductor device 1, if a potential higher than a potential for the emitter electrode 11 is applied to the collector electrode 10, and a potential equal to or higher than a threshold value is applied to the gate electrodes 50, conduction channels are formed in the base region 30 along the gate insulating films 51 such that a current flows between the emitter and the collector.

Figure 3:
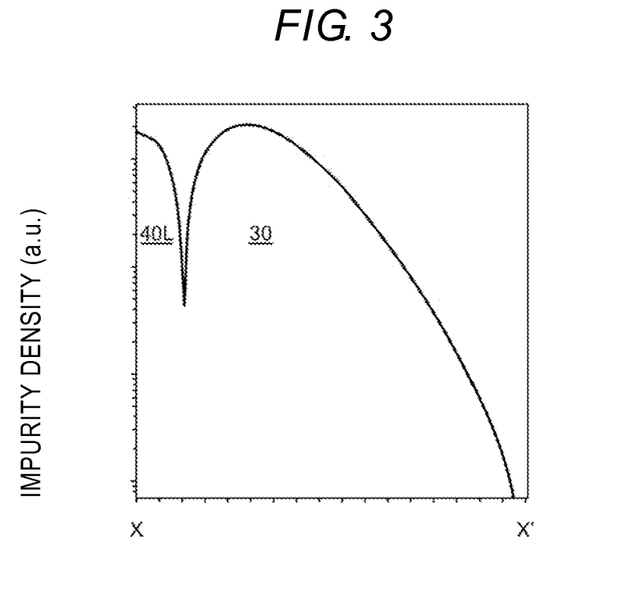
FIG. 3 depicts a dopant density profile in the semiconductor device according to the first embodiment.

FIG. 3 is a view schematically illustrating a dopant density profile between an emitter region 40L and the base region 30 in the semiconductor device according to the first embodiment.

In FIG. 3, the horizontal axis represents a distance between a point X and a point X' illustrated in FIG. 1, and the vertical axis represents the dopant density (in an arbitrary unit (a.u.)) for establishing expected responses to changes in dopant density.

Here, the term "dopant density" means an effective impurity density contributing to the conductivity of a semiconductor material. For example, in a case where a semiconductor material contains dopants which can be donors and dopants which can be acceptors, the density of activated dopants net of the donors and acceptors canceling each other is referred to as a dopant density.

For example, in the semiconductor device 1, the maximum value of the density of dopants contained in the base region 30, and the maximum value of the density of dopants contained in the emitter regions 40L are substantially the same.

An example of an operation of a semiconductor device (IGBT) according to a reference example will first be described.

Figure 4A:
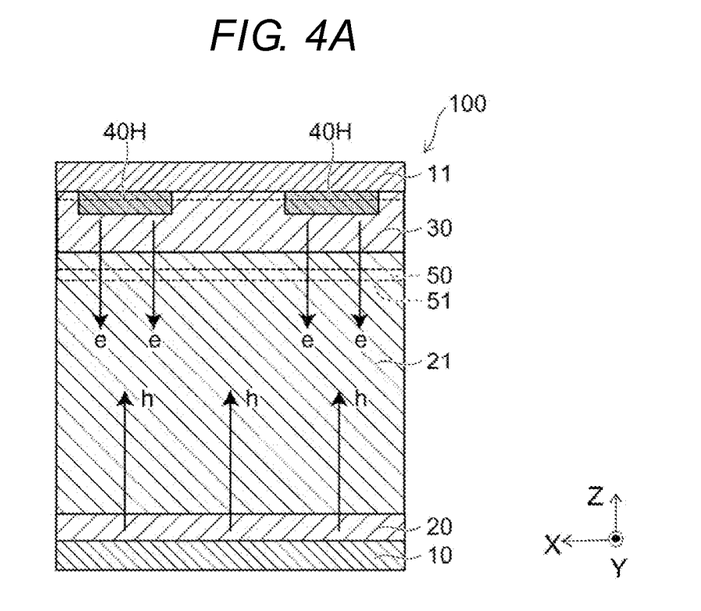
FIGS. 4A and 4B are cross-sectional views schematically illustrating an example of an operation of a semiconductor device according to a reference example.
Figure 4B:
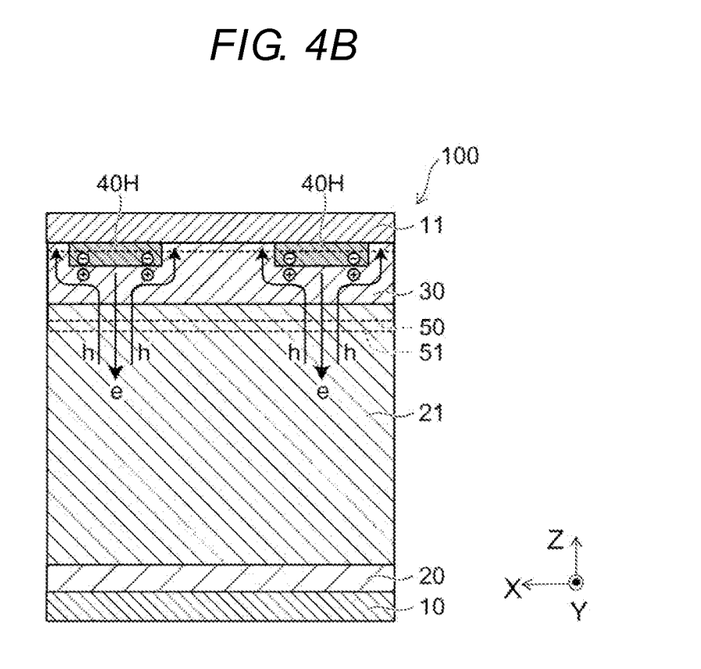

FIGS. 4A and 4B are cross-sectional views schematically illustrating an example of an operation of a semiconductor device according to a reference example.

FIGS. 4A and 4B illustrate a cross section corresponding to the direction of FIG. 2C described above. In a semiconductor device 100 illustrated in FIGS. 4A and 4B, only high-density emitter regions 40H are provided as emitter regions. The other configuration details are similar to that of semiconductor device 1.

In the semiconductor device 100 according to the reference example, if a potential higher than a potential of the emitter electrode 11 is applied to the collector electrode 10, and a potential equal to or higher than a threshold value is applied to the gate electrodes 50, conduction channels are formed in the base region 30 along the gate insulating films 51 such that a current flows between the emitter and the collector.

For example, as illustrated in FIG. 4A, electrons (e) are injected from the emitter regions 40H toward the collector region 20 through the channels, and holes (h) are injected from the collector region 20 toward the emitter regions 40H and the base region 30. Also, holes (h) generated by avalanche may flow toward the emitter regions 40H and the base region 30.

As illustrated in FIG. 4B, the holes travel in the base region 21 and flow into the base region 30. Thereafter, the holes (h) reach regions immediately under the emitter regions 40H. The holes (h) move in a lateral direction (e.g., X-direction in FIG. 4B) before flowing into the emitter electrode 11 through the low potential portions of base region 30, rather than going over energy barriers between the base region 30 and the emitter regions 40H. That is, the holes (h) do not flow direction from base region 30 into the emitter regions 40H, but rather avoid the emitter regions 40H on the way to emitter electrode 11.

Due to the lateral movement of the holes (h), a voltage drop occurs in the base region 30 positioned below the emitter regions 40H. As a result, the base region 30 positioned below the emitter regions 40H is biased to be positive with respect to the emitter regions 40H.

Due to this bias, with respect to the electrons (e), the energy barriers between the emitter regions 40H and the base region 30 become low. As a result, the electrons (e) are injected from the emitter regions 40H into the base region 30.

That is, in the semiconductor device 100, channels are formed in the base region 30 such that an electronic current flows. Further, the energy barriers between the emitter regions 40H and the base region 30 become low. As a result, a latch-up in which electrons (e) are injected into the base region 30 occurs. When a latch-up occurs, on/off control using the gate electrodes 50 becomes impossible.

In contrast to this reference example, semiconductor device 1 according to the first embodiment will be described.

Figure 5A:
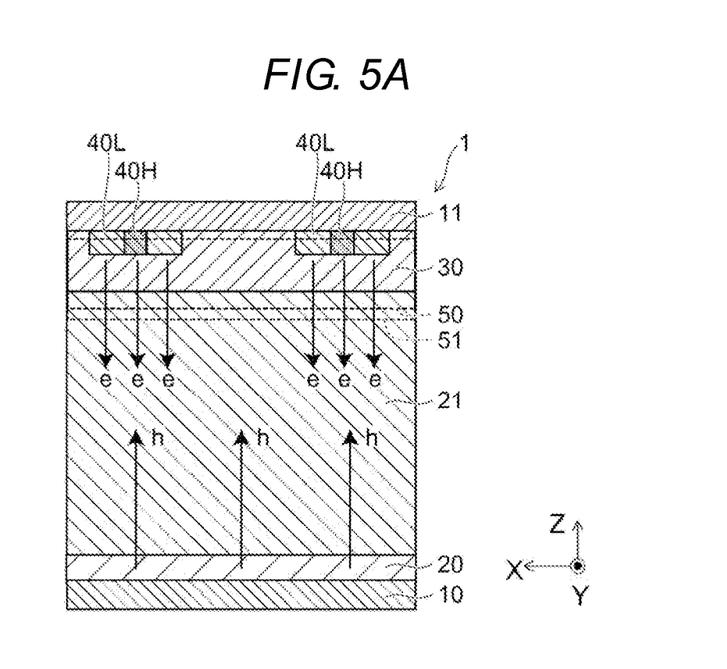
FIGS. 5A and 5B are cross-sectional views schematically illustrating an example of an operation of the semiconductor device according to the first embodiment.
Figure 5B:
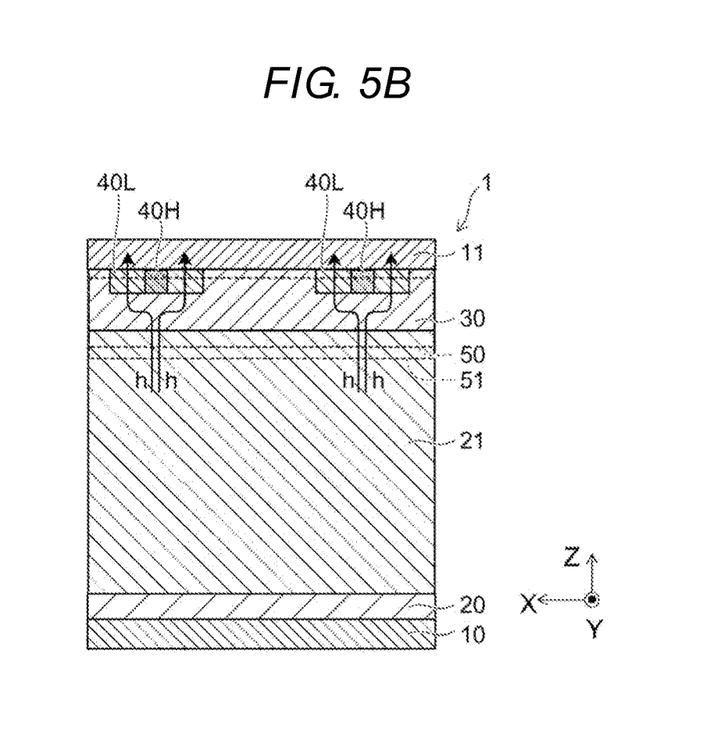

FIGS. 5A and 5B are cross-sectional views schematically illustrating an example of an operation of the semiconductor device according to the first embodiment.

FIGS. 5A and 5B illustrate a cross section corresponding to the direction of FIG. 2C described above.

In the semiconductor device 1, if a potential higher than a potential for the emitter electrode 11 is applied to the collector electrode 10, and a potential equal to or higher than a threshold value is applied to the gate electrodes 50, conduction channels are formed in the base region 30 along the gate insulating films 51 such that a current flows between the emitter and the collector.

For example, as illustrated in FIG. 5A, electrons (e) are injected from the emitter regions 40H and 40L toward the collector region 20 through the channels, and holes (h) are injected from the collector region 20 toward the emitter regions 40H and the base region 30. Also, holes (h) generated by avalanche may flow toward the emitter regions 40H and 40L and the base region 30.

As illustrated in FIG. 5B, the holes (h) travel in the base region 21 and flow into the base region 30. Thereafter, the holes (h) reach regions immediately under the emitter regions 40H and 40L. The holes (h) flow into the emitter electrode 11 through the emitter region 40L having a potential lower than that of the emitter region 40H, rather than going over the energy barriers between the base region 30 and the emitter regions 40H. Also, some holes (h) travel in the base region 21 and flow into the base region 30.

Here, at the junctions of the emitter regions 40L and the emitter electrode 11, with respect to electrons (e), ohmic contact or Schottky barriers are formed. However, the Schottky barriers do not become energy barriers against holes (h).

Therefore, holes (h) move in a lateral direction only under the narrow emitter regions 40H, and then are discharged into the emitter electrode 11 through the emitter regions 40L or the base region 21. As a result, in the semiconductor device 1, it is difficult for a voltage drop to occur at the base region 30 positioned below the emitter regions 40H, as compared to the semiconductor device 100.

That is, as compared to the reference example, it is difficult for a bias voltage to be applied to the base region 30 positioned below the emitter regions 40H. Therefore, it is possible to suppress electrons from being injected from the emitter regions 40H into the base region 30.

As described above, in the semiconductor device 1, it is possible to make the potential of the gate electrodes 50 higher than the threshold value, thereby forming channels in the base region 30 such that an electronic current flows. Further, in the semiconductor device 1, it is possible to suppress a latch-up from being caused by injection of electrons (e) from the emitter regions 40H into the base region 30. That is, according to the first embodiment, it is possible to form a more reliable semiconductor device.

Also, the emitter regions 40L are in contact with the emitter regions 40H. Therefore, during turn-on of the semiconductor device 1, electrons are injected from the high-density emitter regions 40H into the base region 30 through the emitter regions 40L. That is, the effective emitter region width in the X direction becomes the sum of the widths of the emitter regions 40L and the widths of the emitter regions 40H. Therefore, in the semiconductor device 1, even if the widths of the emitter regions 40H are narrow, a channel density does not decrease. That is, even when the breakdown resistance is improved, the on-resistance of the semiconductor device 1 does not increase.

Second Embodiment

Figure 6:
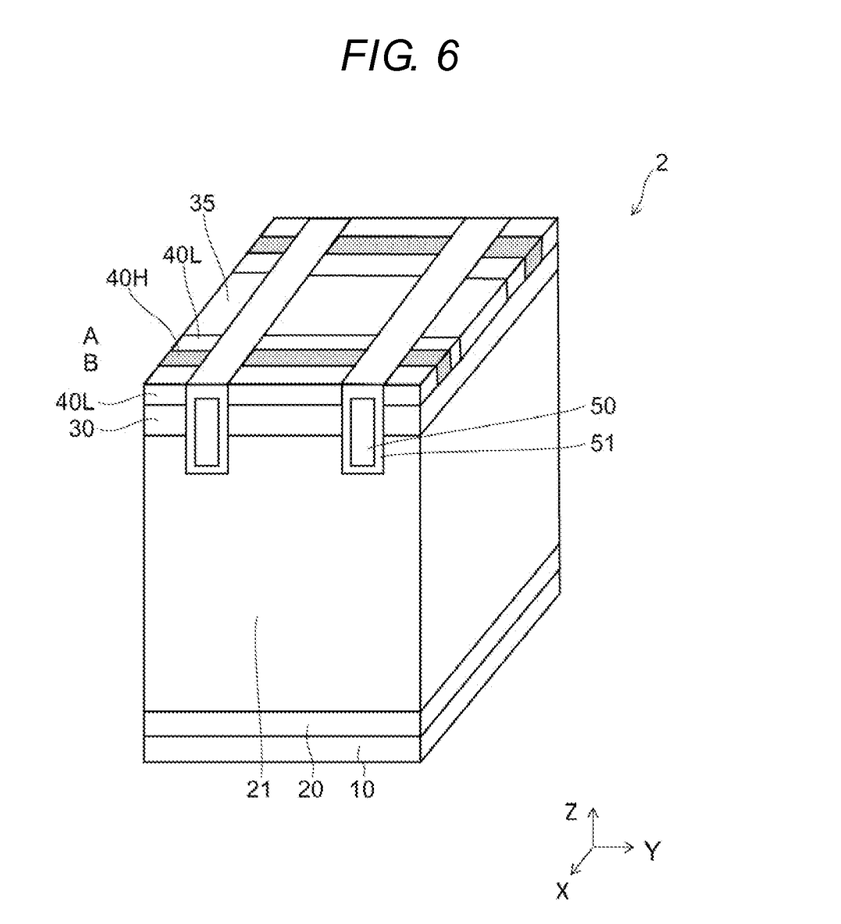
FIG. 6 depicts a semiconductor device according to a second embodiment.

FIG. 6 is a perspective view schematically illustrating a semiconductor device according to a second embodiment.

In FIG. 6, the emitter electrode 11 is not specifically depicted.

A semiconductor device 2 further includes a $p^+$ type contact regions 35 (sixth semiconductor regions) in addition to the configuration of the semiconductor device 1. The contact regions 35 are provided on the base region 30 to be between the base region 30 and the emitter electrode 11. The dopant density of the contact regions 35 is higher than the dopant density of the base region 30. In the semiconductor device 2, in the X direction, each emitter region 40L is between an emitter region 40H and a contact region 35.

Here, the width of each emitter region 40L in the X direction is larger than a length by which the n type dopants of the emitter regions 40H diffuse in the surrounding semiconductor material by a heat treatment of a wafer process. That is, the width of each emitter region 40L is greater than the expected n-type dopant diffusion distance during device fabrication steps involving thermal processing. For example, in the X direction, the width of each emitter region 40L is 1 μm to 5 μm, and the width of each emitter region 40H is 0.1 μm to 1 μm, and the width of each contact region 35 is 1 μm to 10 μm.

According to the semiconductor device 2, holes generated by avalanche may be discharged into the emitter electrode 11 through the $p^+$ type contact regions 35. That is, in the semiconductor device 2, in addition to the effects of the semiconductor device 1, avalanche resistance is improved.

Third Embodiment

Figure 7:
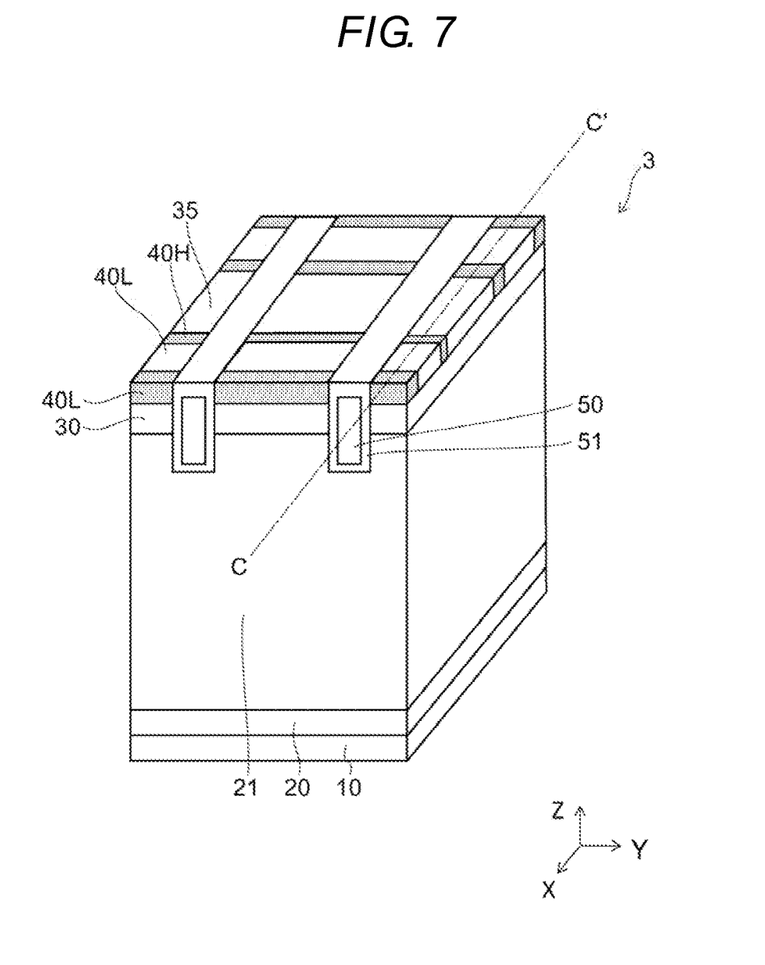
FIG. 7 depicts a semiconductor device according to a third embodiment.

FIG. 7 is a perspective view schematically illustrating a semiconductor device according to a third embodiment.

In FIG. 7, the emitter electrode 11 is not specifically depicted.

A semiconductor device 3 includes $p^+$ type contact regions 35 in addition to the configuration of the semiconductor device 1. Further, in the semiconductor device 3, in the X direction, each emitter region 40H is between an emitter region 40L and a contact region 35. In the X direction, the widths of the emitter regions 40L are larger than the widths of the emitter regions 40H.

Here, the width of each emitter region 40L in the X direction is larger than a length by which the n type dopants of the emitter regions 40H diffuse in the surrounding semiconductor material by a heat treatment of a wafer process. That is, the width of each emitter region 40L is greater than the expected n-type dopant diffusion distance during device fabrication steps involving thermal processing. For example, in the X direction, the width of each emitter region 40L is 1 μm to 5 μm, and the width of each emitter region 40H is 0.1 μm to 1 μm, and the width of each contact region 35 is 1 μm to 10 μm.

Figure 8:
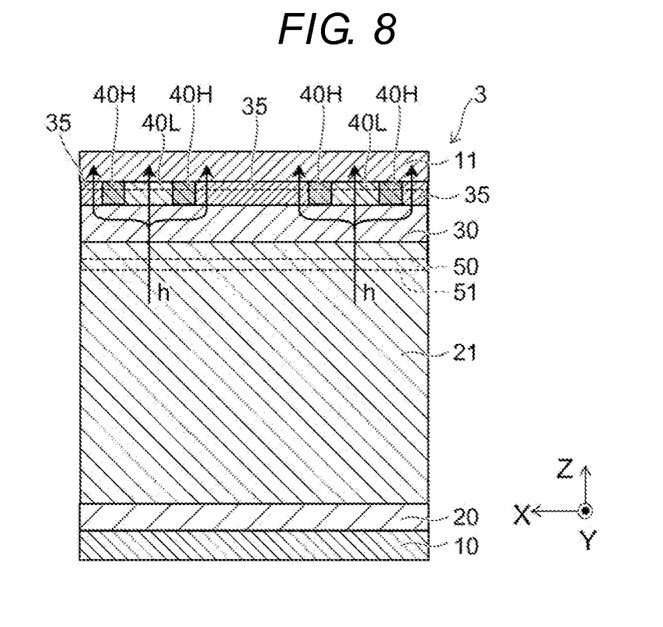
FIG. 8 is a cross-sectional view schematically illustrating an example of an operation of the semiconductor device according to the third embodiment.

FIG. 8 is a cross-sectional view schematically illustrating an example of an operation of the semiconductor device according to the third embodiment.

FIG. 8 illustrates a cross section obtained by cutting the semiconductor device 3 in the Z direction along a line C-C' of FIG. 7 (a cross section corresponding to the direction of FIG. 2C described above). FIG. 8 illustrates a state where holes (h) are discharged toward the emitter electrode 11.

In the semiconductor device 3, in the Z direction, each emitter region 40H is interposed between an emitter region 40L and a contact region 35. In other words, in the Z direction, on both sides of each low-density emitter region 40L, high-density emitter regions 40H are positioned, and on the outer sides of the emitter regions 40H, contact regions 35 are disposed.

Holes (h) having traveled in the base region 21 and having flowed into the base region 30 reach regions immediately under the emitter regions 40H and the emitter regions 40L flow into the emitter electrode 11 through the emitter regions 40L, rather than going over the energy barriers between the base region 30 and the emitter regions 40H. That is, the holes (h) are discharged into the emitter electrode 11 through the emitter regions 40L interposed between the emitter regions 40H. Also, holes (h) which do not pass through the emitter regions 40L are discharged into the emitter electrode 11 through the base region 30 and the contact region 35.

That is, in the semiconductor device 3, paths through which holes (h) are discharged into the emitter electrode 11 are distributed in the X direction, as compared to the semiconductor device 2. As a result, the hole density under the emitter regions 40H and 40L further decreases. Therefore, in the semiconductor device 3, it is possible to further suppress a voltage drop at the base region 30 positioned below the emitter regions 40H and 40L, as compared to the semiconductor device 2. Therefore, it is possible to further suppress electron injection from the emitter regions 40H into the base region 30.

As described above, even in the semiconductor device 3, it is possible to suppress a latch-up from being caused by injection of electrons (e) from the emitter region 40H into the base region 30. That is, according to the third embodiment, it is possible to form a more reliable semiconductor device.

Also, the substantial emitter region width in the X direction becomes the sum of the widths of the emitter regions 40L and the widths of the emitter regions 40H. Therefore, in the semiconductor device 3, even if the widths of the emitter regions 40H are narrow, a channel density does not decrease. That is, even if the breakdown resistance is improved, the on-resistance of the semiconductor device 3 does not increase.

Fourth Embodiment

Figure 9:
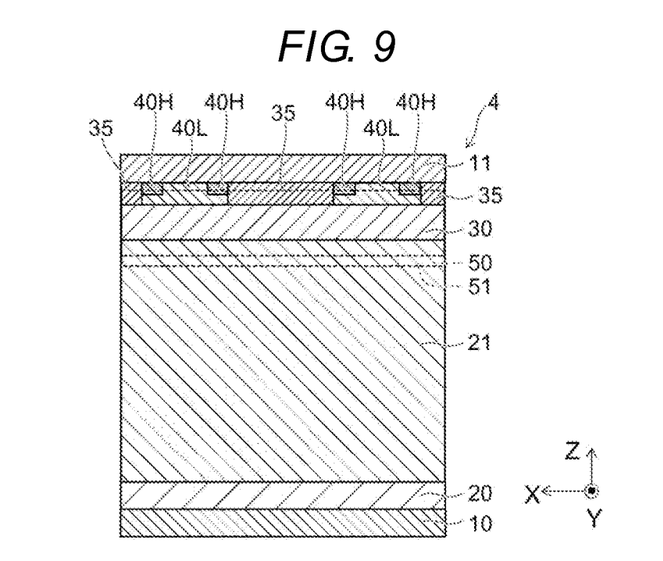
FIG. 9 is a cross-sectional view schematically illustrating a semiconductor device according to a fourth embodiment.

FIG. 9 is a cross-sectional view schematically illustrating a semiconductor device according to a fourth embodiment.

FIG. 9 illustrates a cross section corresponding to the direction of FIG. 8. A semiconductor device 4 includes the similar elements as those of the semiconductor device 3. However, in the semiconductor device 4, in the Z direction, each emitter region 40L (portions of each emitter region 40L) is provided between emitter regions 40H and the base region 30. That is, the semiconductor device 4 has a structure in which the base region 30 is in contact with the emitter regions 40L and is not in contact with the emitter regions 40H.

According to this structure, the base region 30 is in contact with the low-density emitter regions 40L, but not with the high-density emitter regions 40H. Therefore, lateral variations in distribution (differences between the emitter regions 40H and the emitter regions 40L) of the dopant density at the junctions of the base region 30 and the emitter regions is reduced, and thus the threshold voltage (Vth) of the gate electrodes 50 becomes more stable.

Fifth Embodiment

Figure 10:
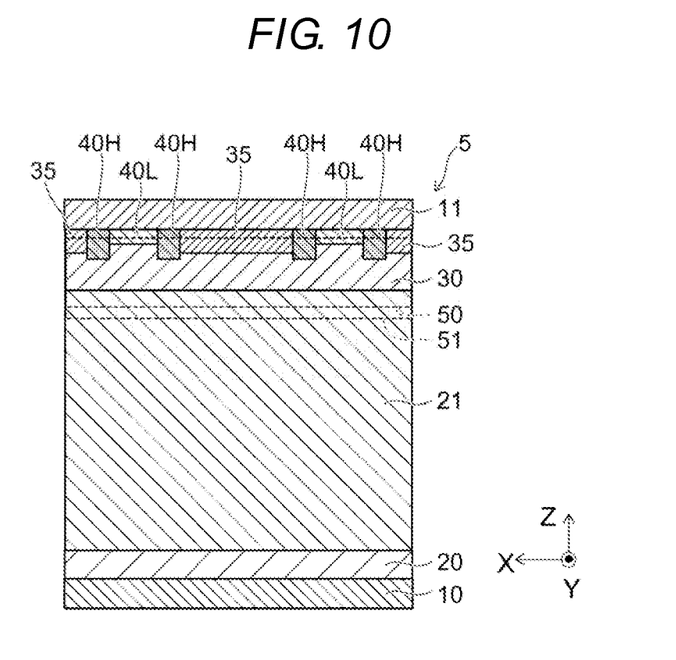
FIG. 10 is a cross-sectional view schematically illustrating a semiconductor device according to a fifth embodiment.

FIG. 10 is a cross-sectional view schematically illustrating a semiconductor device according to a fifth embodiment.

FIG. 10 illustrates a cross section corresponding to the direction of FIG. 8. A semiconductor device 5 includes the similar elements as those of the semiconductor device 3. If a dopant activating process (e.g., heat treatment) is performed during wafer processing, then dopants diffuse from a region having a higher impurity density into a region having a lower impurity density. This example embodiment has an advantage that it is possible to simplify the manufacturing process. Therefore, in the semiconductor device 5, the high-density emitter regions 40H are formed to be deeper (extends further in to the base region 30) than the low-density emitter regions 40L. That is, the lower portion of high-density emitter region 40H is below (e.g., lower in Z-direction of FIG. 10) the lower portion of low-density emitter region 40L.

In a case where a semiconductor device described above is a metal oxide semiconductor field effect transistor (MOSFET) having a vertical electrode structure, the collector region 20 may be an $n^+$ type drain region. In the case where the semiconductor device is a MOSFET, the terms "emitter" and "collector" may be referred to as "source" and "drain", respectively. Also, the base region 21 may be referred to as a drift region 21. Also, it is contemplated by the present disclosure that the first conductivity type and the second conductivity type may be replaced with each other. That is, a p-type dopant and a n-type dopant in the various example embodiments may be reversed in disclosed embodiments to provide additional embodiments.

The embodiments have been described above with reference to specific examples. However, the embodiments are not limited to those specific examples. That is, those skilled in the art may appropriately modify the designs of those specific examples, and such modifications are also included in the scope of the embodiments as long as the modifications have the features of the embodiments. Each element of the above described each specific example, and the disposition, material, condition, shape, size, and the like of the corresponding element are not limited to those having been illustrated, but may be appropriately changed.

In addition, the individual elements included in the embodiments described above may be combined as long as it is technically possible, and combinations thereof are included in the scope of the embodiments, as long as it has the features of the embodiments. Furthermore, a variety of variations and modifications may be considered by those skilled in the art, and it is understood that such variations and modifications to be within the scope of the disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device having regions of first and second conductivity types that are opposite conductivity types, comprising:
   a first semiconductor region of the second conductivity type between, in a first direction, a first electrode and a second electrode;
   a second semiconductor region of the first conductivity type between, in the first direction, the first semiconductor region and the second electrode;
   a third semiconductor region of the second conductivity type between, in the first direction, the second semiconductor region and the second electrode;
   a fourth semiconductor region of the first conductivity type between, in the first direction, the third semiconductor region and the second electrode;
   a fifth semiconductor region of the first conductivity type between, in the first direction, the third semiconductor region and the second electrode, the fourth and fifth semiconductor regions being adjacent to each other in a second direction that is perpendicular to the first direction, a dopant concentration in the fifth semiconductor region being less than a dopant concentration in the fourth semiconductor region; and
   a third electrode contacting the second semiconductor region, the third semiconductor region, the fourth semiconductor region, and the fifth semiconductor region via an insulating film.

2. The semiconductor device according to claim 1, wherein a width, along the second direction, of the fourth semiconductor region is less than a width, along the second direction, of the fifth semiconductor region.

3. The semiconductor device according to claim 2, wherein
   a maximum value of the dopant concentration in the fourth semiconductor region is greater than $5 \times 10^{18}$ cm$^{-3}$, and
   a maximum value of the dopant concentration in the fifth semiconductor region is equal to or less than $1 \times 10^{18}$ cm$^{-3}$.

4. The semiconductor device according to claim 1, wherein
   a maximum value of the dopant concentration in the fourth semiconductor region is greater than $5 \times 10^{18}$ cm$^{-3}$, and
   a maximum value of the dopant concentration in the fifth semiconductor region is equal to or less than $1 \times 10^{18}$ cm$^{-3}$.

5. The semiconductor device according to claim 1, further comprising:
   a sixth semiconductor region of the second conductivity type between the third semiconductor region and the second electrode, a dopant concentration in the sixth semiconductor region being greater than a dopant concentration of the third semiconductor region, wherein
   the fifth semiconductor region is between, in the second direction, the fourth semiconductor region and the sixth semiconductor region.

6. The semiconductor device according to claim 5, wherein the fifth semiconductor region is between, in the first direction, the fourth semiconductor region and the third semiconductor region.

7. The semiconductor device according to claim 1, further comprising:
   a sixth semiconductor region of the second conductivity between the third semiconductor region and the second electrode, a dopant concentration in the sixth semiconductor region being greater than higher than a dopant concentration of the third semiconductor region, wherein
   the fourth semiconductor region is between, in the second direction, the fifth semiconductor region and the sixth semiconductor region.

8. The semiconductor device according to claim 7, wherein the fifth semiconductor region is between, in the first direction, the fourth semiconductor region and the third semiconductor region in the first direction.

9. The semiconductor device according to claim 1, wherein the fifth semiconductor region is in Schottky contact with the second electrode.

10. The semiconductor device according to claim 1, wherein the semiconductor device is a metal-oxide-semiconductor field effect transistor.

11. The semiconductor device according to claim 1, wherein the semiconductor device is an insulated gate bipolar transistor.

12. A semiconductor device having regions of first and second conductivity types that are opposite conductivity types, comprising:
    a first semiconductor region of the second conductivity type between, in a first direction, a first electrode and a second electrode;
    a second semiconductor region of the first conductivity type between, in the first direction, the first semiconductor region and the second electrode, the first conductivity type being opposite of the second conductivity type;
    a third semiconductor region of the second conductivity type between, in the first direction, the second semiconductor region and the second electrode;

a fourth semiconductor region of the first conductivity type between, in the first direction, the third semiconductor region and the second electrode;

a fifth semiconductor region of the first conductivity type between, in the first direction, the third semiconductor region and the second electrode, the fourth and fifth semiconductor regions being adjacent to each other in a second direction that is perpendicular to the first direction, a dopant concentration in the fifth semiconductor region being less than a dopant concentration in the fourth semiconductor region;

a sixth semiconductor region of the second conductivity type between the third semiconductor region and the second electrode, a dopant concentration in the sixth semiconductor region being greater than a dopant concentration of the third semiconductor region; and a third electrode contacting the second semiconductor region, the third semiconductor region, the fourth semiconductor region, and the fifth semiconductor region via an insulating film.

13. The semiconductor device according to claim 12, wherein the fifth semiconductor region is between, in the second direction, the fourth semiconductor region and the sixth semiconductor region.

14. The semiconductor device according to claim 12, wherein the fourth semiconductor region is between, in the second direction, the fifth semiconductor region and the sixth semiconductor region.

15. The semiconductor device according to claim 12, wherein a width, along the second direction, of the fourth semiconductor region is less than a width, along the second direction, of the fifth semiconductor region.

16. The semiconductor device according to claim 12, wherein a distance, in the first direction, between a portion of the fourth semiconductor region and the first electrode is less than a distance, in the first direction, between any portion of the fifth semiconductor region and the first electrode.

17. A semiconductor device having regions of first and second conductivity types that are opposite conductivity types, comprising:
   a first electrode;
   a second electrode;
   a first semiconductor region of the second conductivity type between, in a first direction, the first electrode and the second electrode;
   a second semiconductor region of the first conductivity type between, in the first direction, the first semiconductor region and the second electrode, the first conductivity type being opposite of the second conductivity type;
   a third semiconductor region of the second conductivity type between, in the first direction, the second semiconductor region and the second electrode;
   a fourth semiconductor region of the first conductivity type between, in the first direction, the third semiconductor region and the second electrode;
   a fifth semiconductor region of the first conductivity type between, in the first direction, the third semiconductor region and the second electrode, the fourth and fifth semiconductor regions being adjacent to each other in a second direction that is perpendicular to the first direction, a dopant concentration in the fifth semiconductor region being less than a dopant concentration in the fourth semiconductor region; and
   a third electrode contacting the second semiconductor region, the third semiconductor region, the fourth semiconductor region, and the fifth semiconductor region via an insulating film.

18. The semiconductor device according to claim 17, further comprising:
   a sixth semiconductor region of the second conductivity type between the third semiconductor region and the second electrode, a dopant concentration in the sixth semiconductor region being greater than a dopant concentration of the third semiconductor region.

19. The semiconductor device according to claim 18, wherein a width, along the second direction, of the fourth semiconductor region is less than a width, along the second direction, of the fifth semiconductor region.

20. The semiconductor device according to claim 19, wherein
   a maximum value of the dopant concentration in the fourth semiconductor region is greater than $5 \times 10^{18}$ cm$^{-3}$, and
   a maximum value of the dopant concentration in the fifth semiconductor region is equal to or less than $1 \times 10^{18}$ cm$^{-3}$.

* * * * *